(12) United States Patent
Zhang et al.

(10) Patent No.: US 12,258,445 B2
(45) Date of Patent: Mar. 25, 2025

(54) CURABLE COMPOSITIONS

(71) Applicant: AGC Multi Material America, Inc., Tempe, AZ (US)

(72) Inventors: Laibao Zhang, Tempe, AZ (US); Kevin Bivona, Tempe, AZ (US); Yoji Nakajima, Tempe, AZ (US); Tomoaki Nakanishi, Tempe, AZ (US); Gregory Roy Almen, Tempe, AZ (US); Wei Qiang, Tempe, AZ (US)

(73) Assignee: AGC Multi Material America, Inc., Tempe, AZ (US)

( * ) Notice: Subject to any disclaimer, the term of this patent is extended or adjusted under 35 U.S.C. 154(b) by 0 days.

(21) Appl. No.: 18/509,002

(22) Filed: Nov. 14, 2023

(65) Prior Publication Data

US 2024/0174803 A1    May 30, 2024

Related U.S. Application Data

(60) Provisional application No. 63/425,787, filed on Nov. 16, 2022.

(51) Int. Cl.
| | | |
|---|---|---|
| *C08J 5/18* | (2006.01) | |
| *C08G 65/40* | (2006.01) | |
| *C08J 5/24* | (2006.01) | |
| *C08K 13/04* | (2006.01) | |
| *C08L 71/12* | (2006.01) | |
| *H05K 1/03* | (2006.01) | |
| *C08K 3/013* | (2018.01) | |
| *C08K 5/00* | (2006.01) | |
| *C08K 7/26* | (2006.01) | |

(52) U.S. Cl.
CPC ............ *C08G 65/4093* (2013.01); *C08J 5/18* (2013.01); *C08J 5/244* (2021.05); *C08J 5/249* (2021.05); *C08K 13/04* (2013.01); *C08L 71/126* (2013.01); *H05K 1/0366* (2013.01); *C08J 2371/12* (2013.01); *C08K 3/013* (2018.01); *C08K 5/0066* (2013.01); *C08K 7/26* (2013.01); *C08K 2201/005* (2013.01); *C08L 2201/02* (2013.01); *C08L 2203/16* (2013.01); *H05K 2201/012* (2013.01); *H05K 2201/029* (2013.01)

(58) Field of Classification Search
USPC ......................................................... 528/93
See application file for complete search history.

(56) References Cited

U.S. PATENT DOCUMENTS

| | | |
|---|---|---|
| 8,227,361 B2 | 7/2012 | Amou et al. |
| 9,258,892 B2 | 2/2016 | Crosley |
| 11,130,861 B2 | 9/2021 | Kawabe et al. |
| 11,134,568 B2 | 9/2021 | Nishimura et al. |
| 11,339,251 B2 | 5/2022 | Nagai et al. |
| 11,377,546 B2 | 7/2022 | Tanigawa et al. |
| 2013/0034725 A1 | 2/2013 | Paul |
| 2017/0226302 A1 | 8/2017 | Saito et al. |
| 2018/0170005 A1 | 6/2018 | Saito et al. |
| 2020/0281076 A1 | 9/2020 | Nishimura et al. |
| 2020/0347219 A1 | 11/2020 | Ding et al. |
| 2021/0108073 A1 | 4/2021 | Kawabe et al. |
| 2021/0246251 A1 | 8/2021 | Sato et al. |
| 2021/0298169 A1 | 9/2021 | Wu et al. |
| 2022/0235179 A1 | 7/2022 | Hifumi et al. |
| 2022/0248526 A1 | 8/2022 | Shiobara et al. |
| 2022/0251254 A1 | 8/2022 | Shimono et al. |
| 2023/0265275 A1 | 8/2023 | Nakanishi et al. |
| 2024/0174623 A1 | 5/2024 | Kuray et al. |
| 2024/0174802 A1 | 5/2024 | Kuray et al. |
| 2024/0182677 A1 | 6/2024 | Nakanishi et al. |

FOREIGN PATENT DOCUMENTS

| | | | | |
|---|---|---|---|---|
| CN | 112979707 B | * | 9/2022 | ........... C07F 9/65815 |
| CN | 118047914 A | | 5/2024 | |
| JP | S63-172747 A | | 7/1988 | |
| JP | 2002026493 A | * | 1/2002 | |
| JP | 2008231280 A | | 10/2008 | |
| JP | 2008248001 A | | 10/2008 | |
| JP | 4338951 B2 | | 10/2009 | |
| JP | 4842024 B2 | | 12/2011 | |
| JP | 5162149 B2 | | 3/2013 | |
| JP | 5249095 B2 | | 7/2013 | |
| JP | 2018039995 A | | 3/2018 | |
| JP | 2019054242 A | | 4/2019 | |
| JP | 2020026515 A | | 2/2020 | |
| JP | 2020105352 A | | 7/2020 | |
| JP | 6981007 B2 | | 12/2021 | |
| JP | 7087859 B2 | | 6/2022 | |
| JP | 7115165 B2 | | 8/2022 | |
| TW | 202214746 A | | 4/2022 | |
| TW | 202305034 A | | 2/2023 | |
| WO | WO 2017115813 A1 | | 7/2017 | |
| WO | WO 2018181842 A1 | | 10/2018 | |

(Continued)

OTHER PUBLICATIONS

CN-112979707-B Machine Translation (Year: 2022).*
JP-2002026493-A Machine Translation (Year: 2002).*
Ying Wang, Synthesis and characterization of novel pyrimidine-containing poly(arylene ether)s, High Performance Polymers, vol. 27, Issue 1, Feb. 2015, pp. 59-64. (Year: 2015).*
International Preliminary Report on Patentability in International Appln. No. PCT/US2023/062934, mailed on Sep. 6, 2024, 9 pages.
International Search Report and Written Opinion in International Appln. No. PCT/US2023/062934, dated May 16, 2023, 10 pages.

(Continued)

*Primary Examiner* — Terressa Boykin
(74) *Attorney, Agent, or Firm* — Fish & Richardson P.C.

(57) ABSTRACT

This disclosure relates to a curable composition that includes at least one poly(arylene ether) copolymer, at least one phosphorus-containing flame retardant, and at least one radical initiator. This disclosure also relates to using the composition to form a film, a laminate, a prepreg, and/or a circuit board.

36 Claims, No Drawings

(56) References Cited

FOREIGN PATENT DOCUMENTS

| | | |
|---|---|---|
| WO | WO 2020175538 A1 | 9/2020 |
| WO | WO 2020179443 A1 | 9/2020 |
| WO | WO 2020213639 A1 | 10/2020 |
| WO | WO 2021112088 A1 | 6/2021 |
| WO | WO 2022050064 A1 | 3/2022 |
| WO | WO 2022172551 A1 | 8/2022 |
| WO | WO 2022210095 A1 | 10/2022 |
| WO | WO 2024053282 A1 | 3/2024 |

OTHER PUBLICATIONS

Sunitha et al., "Kinetics of Alder-ene reaction of Tris(2-allylphenoxy)triphenoxycyclotriphosphazene and bismaleimides—a DSC study," Thermochimica Acta, Jul. 2001, 374(2): 159-169.
Third-Party Observation in Taiwan Appln. No. 112143909, dated Nov. 12, 2024, 54 pages (with English Translation).

\* cited by examiner

CURABLE COMPOSITIONS

The present application claims the benefit of U.S. Provisional Application No. 63/425,787, filed Nov. 16, 2022, which is incorporated herein by reference in its entirety.

TECHNICAL FIELD

The present disclosure relates to curable compositions, as well as related methods, films, laminates, prepregs, and circuit boards.

BACKGROUND

To meet increasing demands of the high-speed computing and communications systems, further reduction in dissipation factor (Df) and insertion loss of printed circuit board (PCB) laminates is needed. In addition, due to environmental concerns relating to the manufacture and disposal of PCB materials, use of halogen-free resin compositions is now being required in many consumer electronics applications.

Current low loss resin systems generally use conventional poly(phenylene ether) (PPE) and hydrocarbon resin-based formulations, which have been found to give low Df and insertion loss, but cannot meet the low Df criteria now being required. In addition, although hydrocarbon resin-based formulations can show very low loss, they have poor UL94 flammability performance. In order to overcome this, very high flame-retardant levels are typically required, which results in poor adhesion properties (e.g., low copper peel and inner layer bond strength (ILBS)), poor thermal properties (e.g., low coefficient thermal expansion (CTE)), and poor moisture resistance, as well as increases in Df.

SUMMARY

The present disclosure is based on the unexpected discovery that certain curable compositions that include a nitrogen-containing poly(arylene ether) polymer and a phosphorus-containing flame retardant can exhibit superior electrical properties (e.g., low Dk and Df), improved flame resistance (e.g., achieving UL94 V-0 flammability performance), improved mechanical properties (e.g., interlayer bond strength), and improved adhesion properties (e.g., peel strength) compared to a conventional curable composition (e.g., a curable composition containing a PPE).

In one aspect, the present disclosure features curable compositions (e.g., halogen-free curable compositions) that include (1) at least one poly(arylene ether) polymer that includes a monomer unit containing a pyrimidine, pyrazine, or pyridazine group, (2) at least one phosphorus-containing flame retardant, and (3) at least one radical initiator.

In another aspect, the present disclosure features a film (e.g., a free-standing or supported film) prepared from a curable composition described herein.

In another aspect, the present disclosure features a prepreg product that includes a woven or non-woven substrate (e.g., a woven or non-woven fabric) impregnated with a curable composition described herein.

In another aspect, the present disclosure features a laminate that includes at least one layer prepared from a prepreg product described herein.

In another aspect, the present disclosure features a circuit board (e.g., a printed circuit board) for use in an electronic product that includes a laminate described herein.

In still another aspect, the present disclosure features a method that includes impregnating a woven or non-woven substrate with a curable composition described herein and curing the composition to form a prepreg product.

The details of one or more embodiments of the disclosed compositions and methods are set forth in the description below. Other features, objects, and advantages of the disclosed compositions and methods will be apparent from the description and the claims.

DETAILED DESCRIPTION

In general, the present disclosure is directed to curable compositions that include at least one (e.g., two or three or more) poly(arylene ether) polymer, at least one phosphorus-containing flame retardant, and at least one (e.g., two or three or more) radical initiator. In some embodiments, the curable compositions described herein can be substantially free of a halogen (e.g., F, Cl, Br, or I). In some embodiments, the polymer described herein can be a homopolymer or a copolymer (e.g., a random copolymer, a graft copolymer, an alternating copolymer, or a block copolymer).

In some embodiments, the poly(arylene ether) polymer described herein is curable or cross-linkable (e.g., either in the presence of an initiator or heat). In some embodiments, the poly(arylene ether) polymer can include at least two carbon-carbon double bonds, which can be either at a polymer chain end (i.e., in an end group) or in the middle of a polymer chain (e.g., in a side chain). As used herein, the "carbon-carbon double bond" refers to a non-aromatic carbon-carbon double bond, such as an ethylenic group or a vinyl group. For example, the poly(arylene ether) polymer can be terminated with a functional group containing a maleimide, styrene, allyl, allyl ether, acrylate, methacrylate, or benzoxazine group (which includes a carbon-carbon double bond).

In some embodiments, the poly(arylene ether) polymer described herein does not include a carbon-carbon double bond, but includes a functional group that can generate radicals under heat, which can be crosslinked. An example of such a functional group is a substituted or unsubstituted benzene group.

In some embodiments, the poly(arylene ether) polymer described herein can include a nitrogen atom in its polymer structure. Without wishing to be bound by theory, it is believed that the nitrogen in the poly(arylene ether) polymer and the phosphorus in the flame retardant can result in a synergistic effect that leads to increased char formation and flame resistance. Hence, use of a nitrogen-containing poly (arylene ether) polymer can lower the amount of the flame retardant in the curable composition, which in turn results in excellent properties such as improved copper peel, ILBS, CTE, moisture resistance, and Df.

In some embodiments, the poly(arylene ether) polymer described herein can include at least one (e.g., two or three or more) first monomer unit and optionally at least one (e.g., two or three or more) second monomer unit different from the first monomer unit. The phrase "monomer unit" mentioned herein refers to a group formed from a monomer and is used interchangeably with "monomer repeat unit" known in the art. In some embodiments, the copolymer includes the first monomer unit and the optional second monomer unit only and does not include any other monomer unit.

In some embodiments, the poly(arylene ether) polymer described herein can include a monomer unit containing a pyridazine, pyrimidine, or pyrazine group. Examples of such a polymer can include a monomer unit having a chemical structure shown in one of the formulas (1)-(3) below:

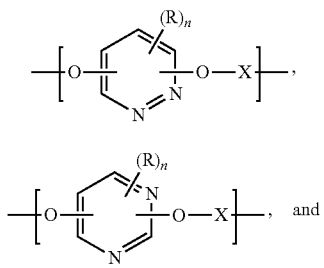  (1)

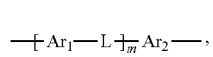  (2) and

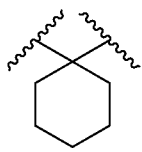  (3)

in which n is 0, 1, or 2; each R independently is a monovalent hydrocarbon group having 1 to 20 carbon atoms (e.g., $C_1$-$C_{20}$ alkyl or $C_6$-$C_{20}$ aryl), CN, NO2, or N(R'R''), where each of R' and R'' is $C_1$-$C_{20}$ alkyl or aryl; and X is a divalent organic group containing an aromatic group (e.g., a phenylene group). In some embodiments, X in formulas (1)-(3) can have a chemical structure shown in formula (4) below:

$$-[-Ar_1-L-]_m-Ar_2-\text{,} \quad (4)$$

in which m is 0, 1, 2, 3, 4, or 5; each of $Ar_1$ and $Ar_2$ independently is an aromatic group (e.g., a phenylene group) optionally substituted by one or more (e.g., 1, 2, 3, or 4) $C_1$-$C_{20}$ alkyl; and L is a single bond, —O—, —S—, —N($R_a$)—, —C(O)—, —SO$_2$—, —P(O)—, or a divalent hydrocarbon group having 1 to 20 carbon atoms (e.g., $C_1$-$C_{20}$ alkyl or

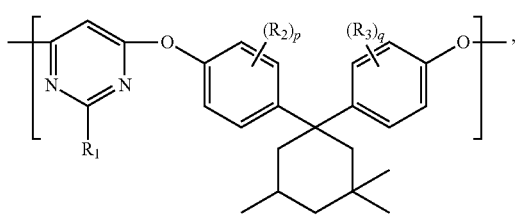

optionally substituted by one or more (e.g., 1, 2, 3, 4, or 5) $C_1$-$C_{10}$ alkyl).

In some embodiments, the poly(arylene ether) polymer described herein can include a monomer unit having a chemical structure shown in one of the formulas (5)-(9) below:

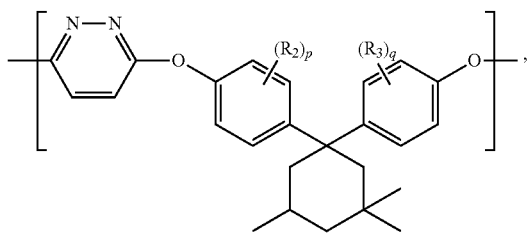  (5)

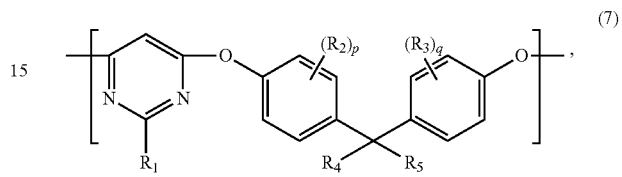  (6)

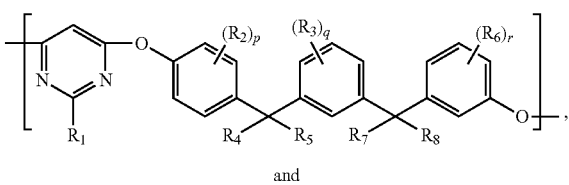  (7)

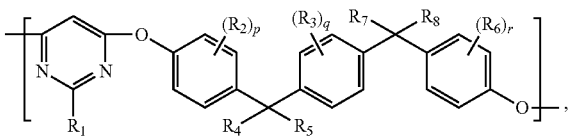  (8)

and

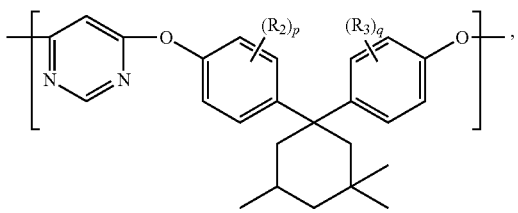  (9)

in which $R_1$ is H, $C_1$-$C_{10}$ alkyl, or aryl; each of $R_2$, $R_3$, and $R_6$, independently, is $C_1$-$C_{10}$ alkyl; each of $R_4$, $R_5$, $R_7$, and $R_8$ is H or $C_1$-$C_{10}$ alkyl; p is an integer from 0 to 4; q is an integer from 0 to 4; and r is an integer from 0 to 4.

Examples of the poly(arylene ether) polymer described herein can include a monomer unit having one of the following chemical structures:

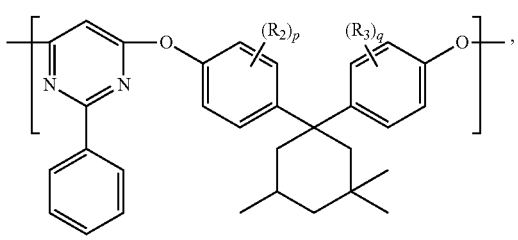

-continued

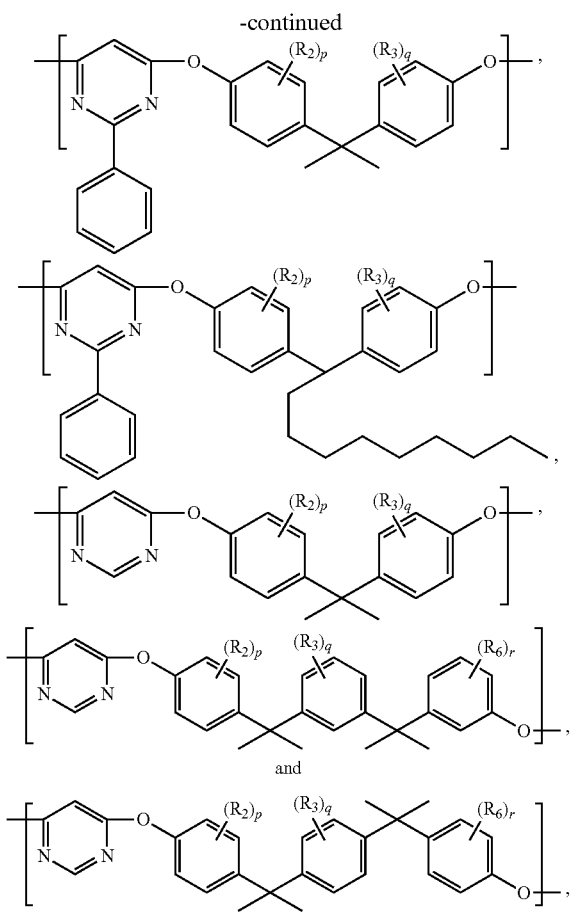

in which p, q, r, $R_2$, $R_3$, and $R_6$ are defined above. A specific example of such a polymer has the following chemical structure:

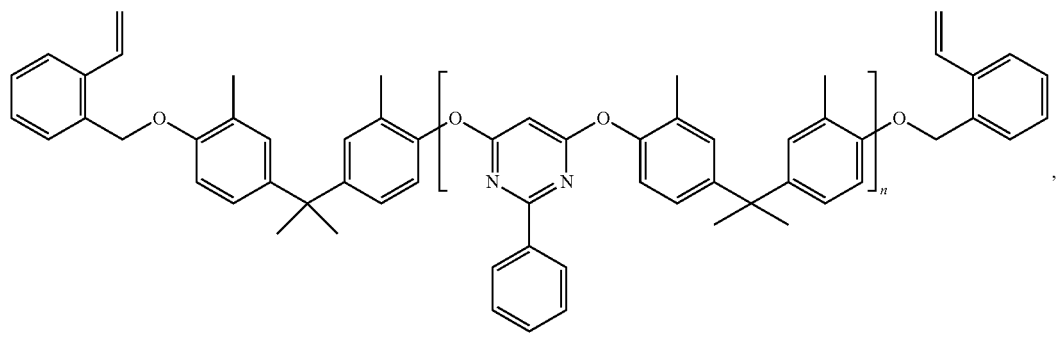

in which n is an integer from 1 to 100. Commercially examples of the poly(arylene ether) polymer described herein include functionalized poly(pyrimidine aryl ether) copolymers JSR HC-G0021 and HC-G0030 available from Japanese Synthetic Rubber Corporation.

In some embodiments, the poly(arylene ether) polymer is present in an amount of from at least about 1 wt % (e.g., at least about 2 wt %, at least about 4 wt %, at least about 5 wt %, at least about 6 wt %, at least about 8 wt %, at least about 10 wt %, at least about 12 wt %, at least about 14 wt %, at least about 15 wt %, at least about 16 wt %, at least about 18 wt %, at least about 20 wt %, at least about 25 wt %, at least about 30 wt %, at least about 35 wt %, or at least about 40 wt %) to at most about 50 wt % (e.g., at most about 45 wt %, at most about 40 wt %, at most about 35 wt %, at most about 30 wt %, at most about 25 wt %, at most about 20 wt %, at most about 15 wt %, or at most about 10 wt %) of the total weight of the curable compositions described herein or the solid content of the curable compositions described herein. Without wishing to be bound by theory, it is believed that a curable composition containing the poly(arylene ether) polymer described herein can have superior electrical properties (e.g., low Dk or Df) and flame resistance.

In some embodiments, the curable compositions described herein can include at least one (e.g., two or three or more) flame retardant. In some embodiments, the flame retardant can include one or more functional groups (e.g., vinyl, allyl, styryl, maleimide, citraconimide, or (meth) acrylate groups) capable of reacting with the poly(arylene ether) polymer described herein. In some embodiments, the flame retardant can be non-reactive to the poly(arylene ether) polymer described herein. In some embodiments, the flame retardant described herein is free of halogen (e.g., F, Cl, Br, or I). In some embodiments, the flame retardant can be soluble (e.g., having a solubility at least about 10 mg/mL) in the cure composition described herein. In some embodiments, the flame retardant can be insoluble (e.g., having a solubility at most about 1 mg/mL) in the cure composition described herein.

In some embodiments, the flame retardant can include a phosphorus atom in its chemical structure. Examples of phosphorus-containing flame retardants include phosphate ester flame retardants, phosphinate flame retardants, and phosphazene flame retardants. Specific examples of suitable phosphorus-containing flame retardants include aluminum diethylphosphinate (e.g., OP-935 available from Clariant Specialty Chemicals), p-xylylene-bis-diphenylphosphine oxide (e.g., PQ-60 available from Chin Yee Chemical Industries Co. Ltd.), (2,5-diallyloxyphenyl)diphenylphosphine oxide, hexaphenoxy cyclotriphosphazene (e.g., SPB-100 available from Otsuka Chemical Co. Ltd.), tris(2-allylphenoxy)triphenoxy cyclotriphosphazene (e.g., SPV-100 available from Otsuka Chemical Co. Ltd.), resorcinol bis(di-2, 6-dimethylphenyl phosphate) (e.g., PX-200 Daihachi Chemical Industry Co. Ltd.), cyanophenoxy(phenoxy)cyclophosphazenes, cresyloxy(phenoxy) cyclophosphazenes, spirocyclophosphazenes, and vinyl-containing phosphazenes. Without wishing to be bound by theory, it is believed that the phosphorus in the flame retardant and the nitrogen in the poly(arylene ether) polymer can result in a synergistic effect that leads to increased char formation and flame resistance, which can reduce the amount of the flame retardant required and improve the properties (e.g., copper peel, ILBS, CTE, moisture resistance, and Df) of the curable composition. In some embodiments, the flame retardant can itself include a nitrogen atom in its chemical structure to facilitate such a synergistic effect.

In some embodiments, the flame retardant described herein can have a relatively low dissipation factor (Df). For example, the flame retardant can have a Df ranging from at most about 0.0025 (e.g., at most about 0.0024, at most about 0.0022, at most about 0.002, at most about 0.0018, at most about 0.0016, at most about 0.0015, at most about 0.0014, at most about 0.0012, at most about 0.001, or at most about 0.0008) to at least about 0.0005 (e.g., at least about 0.0006, at least about 0.0008, or at least about 0.001).

In some embodiments, the flame retardant is present in an amount of from at least about 1 wt % (e.g., at least about 2 wt %, at least about 4 wt %, at least about 5 wt %, at least about 6 wt %, at least about 8 wt %, at least about 10 wt %, at least about 12 wt %, at least about 14 wt %, at least about 15 wt %, at least about 16 wt %, at least about 18 wt %, at least about 20 wt %, at least about 25 wt %, at least about 30 wt %, or at least about 35 wt %) to at most about 45 wt % (e.g., at most about 43 wt %, at most about 41 wt %, at most about 39 wt %, at most about 37 wt %, at most about 35 wt %, at most about 30 wt %, at most about 25 wt %, at most about 20 wt %, at most about 15 wt %, or at most about 10 wt %) of the total weight of the curable compositions described herein or the solid content of the curable compositions described herein.

In some embodiments, the curable compositions described herein can include at least one (e.g., two or three or more) radical initiator. In some embodiments, the radical initiator can include a peroxide (e.g., di-(tert-butylperoxyisopropyl)benzene, bis(1-methyl-1-phenylethyl) peroxide, 2,5-dimethyl-2,5-di(t-butylperoxy)hexyne-3, 2,5-dimethyl-2,5-di(t-butylperoxy)hexane, or dicumyl peroxide), an aromatic hydrocarbon (e.g., bis(4-vinylphenyl)ethane, 3,4-dimethyl-3,4-diphenyl hexane, or 2,3-dimethyl-2,3-diphenyl butane), or an azo compound (e.g., 2,2'-azobis(2,4,4-trimethylpentane)). Without wishing to be bound by theory, it is believed the radical initiator can facilitate the curing of a curable composition (e.g., by initiating a cross-linking reaction of the poly(arylene ether) polymer described herein) when the composition is used to form a prepreg product or a laminate.

In some embodiments, the radical initiator described herein is a non-peroxide radical initiator. Without wishing to be bound by theory, it is believed that decomposition products of peroxide initiators (and the peroxide initiators themselves) are polar and can lead to increased Df in cured compositions. On the other hand, without wishing to be bound by theory, it is believed that non-peroxide initiators (e.g., hydrocarbons such as 2,3-dimethyl-2,3-diphenyl butane) do not contain polar atoms and therefore can lower the Df of cured compositions.

In some embodiments, the curable compositions described herein can include both a peroxide radical initiator and a non-peroxide radical initiator. Without wishing to be bound by theory, it is believed that a non-peroxide initiator may have a relatively high activation energy and therefore may not be efficient in curing the compositions described herein. Thus, without wishing to be bound by theory, it is believed that, in some embodiments, using a combination of a peroxide initiator and a non-peroxide initiator may result in a curable composition having optimal curing rate and Df.

In some embodiments, the curable compositions described herein do not include a radical initiator. In some embodiments, the compositions can be cured by heating.

In some embodiments, the radical initiator is present in an amount of from at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 1.5 wt %, at least about 2 wt %, at least about 2.5 wt %, or at least about 3 wt %) to at most about 10 wt % (e.g., at most about 9 wt %, at most about 8 wt %, at most about 7 wt %, at most about 6 wt %, at most about 5 wt %, at most about 4 wt %, at most about 3 wt %, at most about 2.5 wt %, at most about 2 wt %, at most about 1.5 wt %, at most about 1 wt %, at most about 0.8 wt %, at most about 0.6 wt %, or at most about 0.5 wt %) of the total weight of the curable compositions described herein or the solid content of the curable compositions described herein.

In some embodiments, the curable compositions described herein can optionally include at least one (e.g., two or three or more) elastomer different from the poly(arylene ether) polymer described herein. In some embodiments, the elastomer can include an ethylene monomer unit, a propylene monomer unit, a butylene monomer unit, an isobutylene monomer unit, a butadiene monomer unit, an isoprene monomer unit, a cyclohexene monomer unit, a styrene monomer unit, or a combination thereof. Examples of suitable elastomers can include a poly(styrene-ethylene-butylene-styrene) (SEBS) copolymer, a poly(methylstyrene-ethylene-butylene-methylstyrene) copolymer, a poly(styrene-ethylene-butylene-styrene) copolymer grafted with maleic anhydride, a poly(styrene-co-divinylbenzene-co-ethylstyrene) copolymer, a poly(methylstyrene-co-4-(dimethylvinylsilylmethyl)styrene) copolymer, a polybutadiene, a poly(butadiene-co-styrene) copolymer, a polydivinylbenzene copolymer, a poly(styrene-ethylene-propylene-styrene) (SEPS) copolymer, a poly(styrene-butadiene-styrene) (SBS) copolymer, a poly(styrene-isoprene-styrene) (SIS) copolymer, or a poly(ethylene-propylene-diene) (EPD) copolymer.

In some embodiments, the elastomer is present in an amount of from at least about 1 wt % (e.g., at least about 2 wt %, at least about 4 wt %, at least about 5 wt %, at least about 6 wt %, at least about 8 wt %, at least about 10 wt %, at least about 15 wt %, at least about 20 wt %, at least about 25 wt %, at least about 30 wt %, or at least about 35 wt %) to at most about 40 wt % (e.g., at most about 35 wt %, at most about 30 wt %, at most about 25 wt %, at most about 20 wt %, at most about 15 wt %, at most about 10 wt %, at most about 8 wt %, at most about 6 wt %, at most about 5 wt %, or at most about 4 wt %) of the total weight of the curable compositions described herein or the solid content of the curable compositions described herein. Preferably, the elastomer is in an amount of from about 1 wt % to about 10 wt % of the solid content of the curable compositions described herein. Without wishing to be bound by theory, it is believed that the elastomer can improve the thermal properties (e.g., a higher glass translation temperature and/or a lower coefficient of thermal expansion), mechanical properties (e.g., copper peel strength and/or inner layer bond strength), or electrical properties (e.g., Dk and/or Df) of the curable compositions described herein.

In some embodiments, the curable compositions described herein can include at least one (e.g., two or three or more) filler (e.g., inorganic filler). Examples of suitable fillers include silica, alumina, quartz, titanium oxide, boron nitride, barium titanate, barium strontium titanate, and polymer particles. In some embodiments, the polymer particles can include a fluoro-containing polymer (e.g., polytetrafluoroethylene). In some embodiments, the at least one filler described herein can include one or more (e.g., two or three) non-hollow, solid fillers and/or one or more (e.g., two or three) hollow fillers.

In some embodiments, the filler can include hollow silica particles (e.g., hollow silica beads). Without wishing to be bound by theories, it is believed that using hollow particles as a filler can improve the electrical properties (e.g., reducing the Dk and/or Df) of the curable compositions described herein.

In some embodiments, the filler (e.g., hollow silica particles) described herein can have a relatively high purity. For example, the filler (e.g., hollow silica particles) can include at least about 95 wt % (e.g., at least about 96 wt %, at least about 97 wt %, at least about 98 wt %, at least about 99 wt %, or at least about 99.5 wt %) silicon dioxide. Without wishing to be bound by theory, it is believed that using a high purity hollow filler can lower the Df of a prepreg product or laminate made from such a filler and can result in less metal contamination that may cause reliability issues.

In some embodiments, the filler (e.g., hollow silica particles) described herein can have a relatively small density. For example, the filler (e.g., hollow silica particles) can have a density of at most about 1.5 g/cm$^3$ (e.g., at most about 1.4 g/cm$^3$, at most about 1.2 g/cm$^3$, at most about 1 g/cm$^3$, at most about 0.8 g/cm$^3$, at most about 0.6 g/cm$^3$, at most about 0.5 g/cm$^3$, or at most about 0.4 g/cm$^3$). Without wishing to be bound by theory, it is believed that a low density filler can have a relative high porosity and therefore using a low density filler can lower the Df and/or Dk of a prepreg product or laminate made from such a filler.

In some embodiments, the filler described herein can have a relatively low dielectric constant (Dk) and/or a relatively low dissipation factor (Df). For example, the filler described herein can have a Dk ranging from at most about 3.1 (e.g., at most about 3, at most about 2.9, at most about 2.8, at most about 2.7, at most about 2.6, at most about 2.5, at most about 2.4, at most about 2.2, or at most about 2) to at least about 1 (e.g., at least about 1.5) at 10 GHz. In some embodiments, the filler described herein can have a dissipation factor (Df) ranging from at most about 0.002 (e.g., at most about 0.0018, at most about 0.0016, at most about 0.0015, at most about 0.0014, at most about 0.0012, at most about 0.001, or at most about 0.0008) to at least about 0.0005 (e.g., at least about 0.0006, at least about 0.0008, or at least about 0.001).

In some embodiments, the filler mentioned herein can have a relatively small particle size. For example, the filler can have a particle size D50 value of at most about 10 μm (e.g., at most about 8 μm, at most about 6 μm, at most about 5 μm, at most about 4 μm, or at most about 2 μm) and/or at least about 0.7 μm (e.g., at least about 0.8 μm, at least about 1 μm, at least about 1.5 μm, or at least about 2 μm). Without wishing to be bound by theory, it is believed that using a filler having a relatively small size can reduce the defects in a prepreg product or laminate made from such a filler during a PCB process.

In some embodiments, the at least one filler is present in an amount of from at least about 10 wt % (e.g., at least about 15 wt %, at least about 20 wt %, at least about 25 wt %, at least about 30 wt %, at least about 35 wt %, at least about 40 wt %, at least about 45 wt %, at least about 50 wt %, at least about 55 wt %, or at least about 60 wt %) to at most about 65 wt % (e.g., at most about 60 wt %, at most about 55 wt %, at most about 50 wt %, at most about 45 wt %, at most about 40 wt %, at most about 35 wt %, at most about 30 wt %, at most about 25 wt %, or at most about 20 wt %) of the total weight of the curable compositions described herein or the solid content of the curable compositions described herein.

In some embodiments, the at least one filler described herein can include a first filler containing hollow silica particles and a second filler different from the hollow silica particles, such as a filler containing boron nitride, barium titanate, barium strontium titanate, titanium oxide, glass (e.g., hollow glass), a fluoro-containing polymer (e.g., polytetrafluoroethylene), or silicone.

In some embodiments, the curable compositions described herein can optionally further include at least one (e.g., two or three or more) coupling agent. In some embodiments, the coupling agent can include a silane, a titanate, or a zirconate. Examples of suitable coupling agents include methacryloxypropyltrimethoxysilane, vinyltrimethoxysilane, hydrolyzed vinylbenzylaminoethylaminopropyltrimethoxy silane, phenyltrimethoxysilane, p-styryltrimethoxysilane, 3-isocyanatepropyltriethoxysilane, 3-methacryloxypropyl trimethoxysilane, tetra(2,2-diallyloxymethyl-1-butyl) bis(ditridecylphosphite)titanate, or tetra(2,2-diallyloxymethyl-1-butyl)bis(ditridecylphosphite) zirconate. Without wishing to be bound by theory, it is believed that the coupling agent can improve the dispersability of an inorganic filler in a curable composition, improve the adhesion between fillers and polymers in a curable composition and between glass cloth in a prepreg product and polymers in a curable composition, improve the moisture and solvent resistance of a curable composition, and decrease the number of voids in a curable composition.

In some embodiments, the coupling agent can be applied onto the surface of the filler (e.g., as a surface treatment agent) before the filler is included in the curable compositions described herein. In some embodiments, the coupling agent can be included in the curable compositions described herein as a component independent of the filler.

In some embodiments, the coupling agent is present in an amount of from at least about 0.1 wt % (e.g., at least about 0.2 wt %, at least about 0.3 wt %, at least about 0.4 wt %, at least about 0.5 wt %, at least about 0.6 wt %, at least about 0.7 wt %, at least about 0.8 wt %, or at least about 0.9 wt %) to at most about 5 wt % (e.g., at most about 0.9 wt %, at most about 0.8 wt %, at most about 0.7 wt %, at most about 0.6 wt %, at most about 0.5 wt %, at most about 0.4 wt %, at most about 0.3 wt %, or at most about 0.2 wt %) of the total weight of the curable compositions described herein or the solid content of the curable compositions described herein.

In some embodiments, the curable compositions described herein can optionally further include at least one (e.g., two or three or more) cross-linking agent. In some embodiments, the cross-linking agent can include triallyl isocyanurate (TAIC), triallyl cyanurate, a bis(vinylphenyl) ether, a bromostyrene (e.g., a dibromostyrene), a polybutadiene, a poly(butadiene-co-styrene) copolymer, divinylbenzene, a di(meth)acrylate, a maleimide compound (e.g., a bismaleimide), a dicyclopentadiene, a tricyclopentadiene, allyl benzoxazines, allyl phosphazenes, ally cyclophosphazenes (e.g., tris(2-allylphenoxy)triphenoxy cyclotriphosphazene), 2,4-diphenyl-4-methyl-1-pentene, trans-stilbene, 5-vinyl-2-norbornene, tricyclopentadiene, dimethano-1H-benz[f]indene, 1,1-diphenylethylene, 4-benzhydrylstyrene, diisopropenylbenzene, diallylisophthalate, alpha-methylstyrene, a bis(vinylphenyl)ethane compound (e.g., 1,2-bis(4-vinylphenyl)ethane, 1,2-bis(3-vinylphenyl-4-vinylphenyl) ethane, 1,2-bis(3-vinylphenyl)ethane), a silane (e.g., a vinylsilane or allysilane), a siloxane (e.g., a vinylsiloxane or allysiloxane), or a silsesquioxane (e.g., a vinyl silsesquioxane or allyl silsesquioxane). Without wishing to be bound by theory, it is believed the cross-linking agent can facilitate the curing of a curable composition when the composition is used to form a prepreg product or a laminate.

In some embodiments, the cross-linking agent described herein is present in an amount of from at least about 1 wt % (e.g., at least about 2 wt %, at least about 3 wt %, at least about 4 wt %, at least about 5 wt %, at least about 6 wt %, at least about 8 wt %, at least about 10 wt %, at least about 12 wt %, at least about 14 wt %, at least about 15 wt %, at least about 16 wt %, at least about 18 wt %, or at least about 20 wt %) to at most about 30 wt % (e.g., at most about 25 wt %, at most about 20 wt %, at most about 15 wt %, at most about 10 wt %, at most about 8 wt %, at most about 6 wt %, at most about 5 wt %, or at most about 4 wt %) of the total weight of the curable compositions described herein or the solid content of the curable compositions described herein. In some embodiments, the curable compositions described herein can be free of a crosslinking agent.

In some embodiments, the curable compositions described herein can optionally further include at least one (e.g., two or three or more) organic solvent. In some embodiments, the organic solvent includes 2-heptanone, methyl ethyl ketone, methyl isobutyl ketone, methyl n-amyl ketone, methyl isoamyl ketone, cyclopentanone, cyclohexanone, benzene, anisole, toluene, 1,3,5-trimethylbenzene, xylene, propylene glycol monomethyl ether, propylene glycol monomethyl ether acetate, or a combination thereof.

In some embodiments, the organic solvent is present in an amount of from at least about 1 wt % (e.g., at least about 5 wt %, at least about 10 wt %, at least about 15 wt %, at least about 20 wt %, at least about 25 wt %, at least about 30 wt %, at least about 35 wt %, or at least about 40 wt %) to at most about 50 wt % (e.g., at most about 45 wt %, at most about 40 wt %, at most about 35 wt %, at most about 30 wt %, at most about 25 wt %, at most about 20 wt %, at most about 15 wt %, or at most about 10 wt %) of the total weight of the curable compositions described herein. Without wishing to be bound by theory, it is believed that, if the organic solvent is less than about 1 wt % of a curable composition, the viscosity of the curable composition may be too high such that the curable composition may be not processed easily. In addition, without wishing to be bound by theory, it is believed that, if the organic solvent is more than about 50 wt % of a curable composition, the viscosity of the curable composition may be too low to keep the coated composition on a surface of a substrate, which can lower coating uniformity and coating efficiency.

In some embodiments, a curable composition described herein has a dielectric constant (Dk) of from at most about 3.1 (e.g., at most about 3, at most about 2.9, at most about 2.8, at most about 2.7, at most about 2.6, at most about 2.5, at most about 2.4, at most about 2.2, or at most about 2) to at least about 1.5 at 10 GHz when the composition is cast as a film. In some embodiments, a curable composition described herein has a dissipation factor (Df) of from at most about 0.002 (e.g., at most about 0.0018, at most about 0.0016, at most about 0.0015, at most about 0.0014, at most about 0.0012, at most about 0.001, or at most about 0.0008) to at least about 0.0005 (e.g., at least about 0.0006, at least about 0.0008, or at least about 0.001) when the composition is cast as a film.

The curable compositions described herein can be prepared by methods well known in the art. For example, the curable compositions can be prepared by mixing the components together.

In some embodiments, the present disclosure features a film (e.g., a free-standing film or a supported film) prepared from a curable composition described herein. For example, a supported film can be prepared by coating a curable composition on a substrate to form a film supported by the substrate. As another example, a free-standing film can be prepared by coating a curable composition on a substrate to form a layer (e.g., a polymeric layer) and removing (e.g., peeling) the layer from the substrate to form the free-standing film. In some embodiments, the film (e.g., a free-standing or supported film) is partially cured. In some embodiments, the film (e.g., a free-standing or supported film) is not cured.

In some embodiments, the film described herein can have a dielectric constant (Dk) of from at most about 3.1 (e.g., at most about 3, at most about 2.9, at most about 2.8, at most about 2.7, at most about 2.6, at most about 2.5, at most about 2.4, at most about 2.2, or at most about 2) to at least about 1.5 at 10 GHz. In some embodiments, the film described herein can have a dissipation factor (Df) of from at most about 0.002 (e.g., at most about 0.0018, at most about 0.0016, at most about 0.0015, at most about 0.0014, at most about 0.0012, at most about 0.001, or at most about 0.0008) to at least about 0.0005 (e.g., at least about 0.0006, at least about 0.0008, or at least about 0.001).

In some embodiments, a curable composition described herein can be applied to a surface of a metal substrate (e.g., a copper foil) to form a resin coated metal substrate (e.g., a resin coated copper foil). In such a resin coated metal substrate, the curable composition can be either cured (e.g., partially or fully) or uncured. The resin coated metal substrate can be used as a dielectric material for building multilayer circuitry in printed circuit boards (PCBs) or wiring boards.

In some embodiments, the present disclosure features a prepreg product prepared from a curable composition described herein. In some embodiments, the prepreg product includes a base material (e.g., a woven or non-woven substrate (such as a fabric or a fibrous material)) impregnated with a curable composition described herein. The base material is also known as the supporting or reinforcing material. The prepreg products described herein can be used in the electronics industry, e.g., to produce printed wiring or circuit boards.

In some embodiments, the present disclosure features an unreinforced film (e.g., a free-standing film or a supported film) prepared from a curable composition described herein without a base material (e.g., a woven or non-woven substrate (such as a fabric or a fibrous material)). For example, a supported film can be prepared by coating a curable composition on a substrate to form a film supported by the substrate. As another example, a free-standing film can be prepared by coating a curable composition on a substrate to form a layer (e.g., a polymeric layer) and removing (e.g., peeling) the layer from the substrate to form the free-standing film. In some embodiments, the film (e.g., a free-standing or supported film) is partially cured. In some embodiments, the film (e.g., a free-standing or supported film) is not cured. The unreinforced films described herein can be used as build-up films in the electronics industry, e.g., to produce IC-packages and printed wiring or circuit boards.

In general, the prepreg products described herein can be produced by impregnating a base material (usually based on glass fibers, either as a woven or nonwoven substrate or in the form of a cross-ply laminate of unidirectionally oriented parallel filaments) with a curable composition described herein, followed by curing the curable composition wholly or in part (e.g., at a temperature ranging from about 150° C. to about 250° C.). The base material impregnated with a partially cured composition is usually referred to as a "prepreg." As mentioned herein, the terms "prepreg" and "prepreg product" are used interchangeably. To make a printed wiring board from a prepreg, one or more layers of the prepreg are laminated with, for example, one or more layers of copper.

In some embodiments, the base material (e.g., containing a woven or non-woven substrate) used in the prepregs described herein can include inorganic fiber base materials such as glass and asbestos. A glass fiber base material is preferable from the viewpoint of flame resistance. Examples of the glass fiber base materials include, but are not limited to, woven fabrics using E glass, NE glass (from Nittobo, Japan), C glass, D glass, S glass, T glass, Quartz glass, L glass, L2 glass, or NER glass; glass non-woven fabrics in which short fibers are adhered into a sheet-like material with an organic binder; and those in which glass fiber and other fiber types are mixed and made fabric.

In some embodiments, a prepreg can be produced by impregnating a curable composition described herein into a base material (e.g., a woven or non-woven substrate) followed by drying. In some embodiments, the prepregs described herein can have a resin content as defined herein of from at least about 50 wt % (e.g., at least about 52 wt %, at least about 54 wt %, at least about 55 wt %, at least about 56 wt %, at least about 58 wt %, at least about 60 wt %, at least about 62 wt %, at least about 64 wt %, or at least about 65 wt %) to at most about 80 wt % (e.g., at most about 78 wt %, at most about 76 wt %, at most about 75 wt %, at most about 74 wt %, at most about 72 wt %, at most about 70 wt %, at most about 68 wt %, at most about 66 wt %, or at most about 65 wt %).

In some embodiments, a metal substrate can be applied to one or both surfaces of the prepreg thus formed to form a laminate. In some embodiments, the prepreg formed above can optionally be laminated with one or more layers of prepregs as necessary to make a composite structure, and a metal foil (e.g., a copper or aluminum foil) can be applied to one or both surfaces of the composite structure to obtain a laminate (or a metal clad laminate). The laminate thus formed can optionally be subjected to further treatment, such as pressurization and hot pressing, which can at least partially (or fully) cure the prepreg layers. The laminate (e.g., a copper clad laminate) can be further layered with additional prepreg layers and cured to make a multilayer printed circuit board.

In some embodiments, the present disclosure features a laminate that includes at least one (e.g., two or three or more) layer prepared from the prepreg product described herein. In some embodiments, the laminate can include (1) a copper substrate (e.g., a copper foil) and (2) at least one prepreg layer laminated on the copper substrate. In some embodiments, one or both surfaces of the prepreg layer can be laminated with the copper substrate. In some embodiments, the present disclosure features a multilayer laminate in which multiple copper clad laminates described herein are stacked on top of each other optionally with one or more prepreg layers between two copper clad laminates. The multilayer laminate thus formed can be pressed and cured to form a multilayer printed circuit board.

In some embodiments, the unreinforced film (e.g., a free-standing film or a supported film) is used as build-up materials to achieve thinner thickness of IC-packages and Printed Circuit Boards.

In some embodiments unreinforced film (e.g., a free-standing film or a supported film) has a thickness of from at most about 150 μm (e.g., at most about 100 μm, at most about 90 μm, at most about 80 μm, at most about 70, at most about 60, or at most about 40) to at least about 10 μm.

In some embodiments, the prepreg layer (i.e., the layer prepared from the prepreg product described herein) or the laminate has a dielectric constant (Dk) of from at most about 3.1 (e.g., at most about 3, at most about 2.9, at most about 2.8, t most about 2.7, at most about 2.6, or at most about 2.5) to at least about 2.2 at 10 GHz.

In some embodiments, the prepreg layer (i.e., the layer prepared from the prepreg product described herein) or the laminate has a dissipation factor (Df) of from at most about 0.002 (e.g., at most about 0.0019, at most about 0.0018, at most about 0.0017, at most about 0.0016, at most about 0.0015, at most about 0.0014, at most about 0.0013, at most about 0.0012, at most about 0.0011, or at most about 0.001) to at least about 0.0005 (e.g., at least about 0.0006, at least about 0.0008, or at least about 0.001). Without wishing to be bound by theory, it is believed that a prepreg layer or laminate having relatively low Dk and/or Df can reduce the total dielectric loss and lower signal loss of a laminate or a multilayer circuit board structure.

In some embodiments, a cured unreinforced film has a dissipation factor (Df) of from at most about 0.003 (e.g., at most about 0.0026, at most about 0.0024, at most about 0.0022, at most about 0.0020, at most about 0.0018, at most about 0.0016, at most about 0.0014, at most about 0.0012, at most about 0.0011, or at most about 0.001) to at least about 0.0005 (e.g., at least about 0.0006, at least about 0.0008, or at least about 0.001). Without wishing to be bound by theory, it is believed that a prepreg layer or laminate having relatively low Dk and/or Df can reduce the total dielectric loss and lower signal loss of a laminate or a multilayer circuit board structure.

In some embodiments, the present disclosure features a printed circuit or wiring board obtained from the laminate described herein. For example, the printed circuit or wiring board can be obtained by performing circuit processing on the copper foil of a copper foil clad laminated board. Circuit processing can be carried out by, for example, forming a resist pattern on the surface of the copper foil, removing unnecessary portions of the foil by etching, removing the resist pattern, forming the required through holes by drilling, again forming the resist pattern, plating to connect the through holes, and finally removing the resist pattern. A multi-layer printed circuit or wiring board can be obtained by additionally laminating the above copper foil clad laminated board on the surface of the printed wiring board obtained in the above manner under the same conditions as described above, followed by performing circuit processing in the same manner as described above. In this case, it is not always necessary to form through holes, and via holes may be formed in their place, or both can be formed. For example, in a printed circuit board (PCB), two pads in corresponding positions on different layers of the circuit board can be electrically connected by a via hole through the board, in which the via hole can be made conductive by electroplating. These laminated boards are then laminated the required number of times to form a printed circuit or wiring board.

The printed circuit or wiring board produced in the above manner can be laminated with a copper substrate on one or both surfaces in the form of an inner layer circuit board. This lamination molding is normally performed under heating and pressurization. A multi-layer printed circuit board can then be obtained by performing circuit processing in the same manner as described above on the resulting metal foil clad laminated board.

EXAMPLES

The present disclosure is illustrated in more detail with reference to the following examples, which are for illustrative purposes and should not be construed as limiting the scope of the present disclosure.

Materials

In the Examples below, BVPE is bis(4-vinylphenyl)ethane from Regina Electronic materials Co. Ltd. Araldite MT 35610 is a bisphenol A benzoxazine available from Huntsman. BMI-TMH is 1,6-bismaleimide (2,2,4-trimethyl) hexane available from Daiwakasei Industries. P-d Benzoxazine and LDAIC are available from Shikoku Kasei. NE-X-9470S is available from DIC. Copolymer A refers to Copolymer A described in Example 1 of U.S. Pat. No. 11,130,861. SBS-A is a styrene-butadiene copolymer available from Nisso America Inc. SEBS-A is a SEBS elastomer modified by maleic anhydride. MSEBMS is a poly(methyl-styrene-ethylene-butylene-methylstyrene) copolymer. M1913 is a SEBS elastomer containing about 30 wt % styrene monomer unit or 30 wt % polystyrene and modified by maleic anhydride available from Asahi Kasei Corp. Kraton 1536, Kraton 1648 and Kraton D1623 are SEBS elastomer available from Kraton Corporation. Vector 4411 is a SIS elastomer available from Dexco Polymers. Septon 2104 is a SEPS elastomer containing about 65 wt % styrene monomer unit or 65 wt % polystyrene available from Kuraray Co. Ltd. Tuftec™ MP10 is amine-modified SEBS available from Asahi Kasei. Ricon-100 is a butadiene styrene copolymer available from Cray Valley. HC-G0021 and HC-G0030 are styrene-terminated, N-containing poly(arylene ether) polymers available from Japanese Synthetic Rubber Corporation. EQ2410-SMC and EQ1010-SMC are respectively solid spherical silica particles having an average diameter of 2 microns and 0.6 microns available from Zhejiang Third Age Material Technology Co. Ltd. (China). SC2500-SVJ is a solid silica with surface modification and is available from Admatechs Co. Ltd. SS-15V is a spherical silica available from Sibelco. HS-200-TM (trimethylsilyl bonded), HS-200-MT (Methacrylsilyl bonded), HS-200-VN (Vinylsilyl bonded) and HS-200 (untreated) are available from AGC Si-Tech Co., Ltd.

BES5-1150P is a phosphorus-containing flame retardant (i.e., p-xylylene-bis-diphenylphosphine oxide) available from Regina Electronics and milled to reduce the particle size to less than 10 microns. PQ-60 is a phosphorus-containing flame retardant (i.e., p-xylylene-bis-diphenylphosphine oxide) available from Chin Yee Chemical Industries Co. Ltd. OP945 is an organic phosphinate available from Clariant's Plastics & Coatings Ltd. BP-PZ is a phosphazene flame retardant available from Otsuka Chemical Co. Ltd. Altexia is 6H-dibenz[c,e][1,2]oxaphosphorin-6,6'-(1,4-ethanediyl)bis-6,6'-dioxide available from Albemarle Corp. PX-200 is resorcinol bis(di-2,6-dimethylphenyl phosphate) available from Daihachi Chemical Industry Co. Ltd. SPB-100 is hexaphenoxy cyclotriphosphazene available from Otsuka Chemical Co. Ltd. SPV-100 is tris(2-allylphenoxy)triphenoxy cyclotriphosphazene available from Otsuka Chemical Co. Ltd. Saytex-8010 is a bromine-containing flame retardant (i.e., 1,1'(ethane-1,2-diyl)bis[pentabromo-benzene]) available from Albemarle Corp. FP-72TP is a cyclophosphazene derivative flame retardant available from Fushimi Pharmaceutical Co., Ltd. CCDFB and CC-P3 are non-peroxide initiators (i.e., 2,3-dimethyl-2,3-diphenylbutane and poly-1,4-diisopropylbenzene, respectively) available from United Initiators, Inc. Perbutyl D is a peroxide initiator (i.e., di-tert-butyl peroxide) available from NOF Corporation. VR-110 is an azo initiator (i.e., 2,2'-azobis(2,4,4-trimethylpentane)) available from Fujifilm Corporation. DiDOPO is 6,6'-(1-phenylethane-1,2-diyl)bis(6H-dibenzo[c,e][1,2]oxaphosphinine 6-oxide) available from Life Chemical (China). VulCup R is α,α-bis(t-butylperoxy)diisopropylbenzene from Arkema Inc. DYBP is 2,5-dimethyl-2,5-di(tert-butylperoxy)hexyne-3 available from United Initiator. DCP is dicumyl peroxide available from Arkema S.A. OFS-6030 is methacryloxypropyl trimethoxysilane available from Dow, Inc. OFS-6224 is hydrolyzed vinylbenzylaminoethylaminopropyltrimethoxy silane available from Dow Chemical Company. OFS-6124 is phenyltrimethoxysilane available from Dow Chemical Company. SIB 1817.0 is 1,2-bis(triethoxysilyl)ethane available from Gelest, Inc.

General Procedure 1

Preparation of Prepregs and Laminates

A curable composition was prepared by dissolving the soluble resin components in toluene. Insoluble silica and flame-retardant components were added and dispersed in the resin varnish using a rotor-stator mixer. A curable composition was poured into a grounded metal pan and a glass cloth (1078NE glass or 2116NE glass) was impregnated with the curable composition by pulling through a gap of metal bars having a gap width of 11-12 mil. The sample was dried with air flow at room temperature for 10 minutes and then heated up to 130° C. for 4 minutes to form a dried prepreg. The dried prepreg was cut into 12×12 inch pieces and two layers of prepreg were laminated with 1 oz HS2-M2-VSP copper foil (Mitsui Mining & Smelting) on both sides to form a laminate. The laminate was cured as follows. After the laminate was set into the pressing machine, a pressure of 200 psi, 250 psi, 300 psi, 350 psi, or 450 psi was applied to the two-layer prepreg, which was then cured using one of cycles A-K described below:

Cycle A: The laminate was heated from room temperature to 420° F. at a heating rate of 6° F./min, kept for 2 hours at 420° F., and cooled down to room temperature at a cooling rate of 10° F./min. The lamination pressure was 350 psi.

Cycle B: The laminate was heated from room temperature to 310° F. at a heating rate of 6° F./min, kept for 30 minutes at 310° F., heating from 310° F. to 420° F. at a heating rate of 6° F./min, kept for 80 minutes at 420° F., and cooled down to room temperature at a cooling rate of 10° F./min. The lamination pressure was 350 psi.

Cycle C: The laminate was heated from room temperature to 420° F. at a heating rate of 6° F./min, kept for 3 hours at 420° F., and cooled down to room temperature at a cooling rate of 10° F./min. The lamination pressure was 350 psi.

Cycle D is similar to Cycle C except that the lamination pressure was 200 psi.

Cycle E is similar to Cycle C except that the lamination pressure was 250 psi.

Cycle F is similar to Cycle C except that the lamination pressure was 300 psi.

Cycle G is similar to Cycle C except that the laminate was kept at 450° F. for 180 minutes.

Cycle H: The laminate was heated from room temperature to 350° F. at a heating rate of 6° F./min, kept for 30 minutes at 350° F., heating from 350° F. to 420° F. at a heating rate of 6° F./min, kept for 60 minutes at 420°

F., and cooled down to room temperature at a cooling rate of 10° F./min. The lamination pressure was 450 psi.

Cycle I is similar to Cycle H except that the laminate was kept at 420° F. for 150 minutes.

Cycle J is similar to Cycle H except that the laminate pressure was 250 psi.

Cycle K is similar to Cycle H except that the laminate was kept at 420° F. for 120 minutes.

Preparation of Unreinforced Films for Resin Flow

A curable composition was prepared by dissolving the soluble resin components in toluene. Insoluble silica and flame-retardant components were added and dispersed in the resin varnish using a rotor-stator mixer. The resin composition was then coated onto a polymer release coated paper using a wire-wound wrapped iron Mayer wet film applicator rod to a consistent thickness. The resin composition on the paper carrier was then heated at 150° C. for ten minutes or until all toluene was evaporated. The consolidated resin composition was then separated from the release coated paper to yield an unreinforced film.

Preparation of Unreinforced Laminates for Dk/Df and CTE Measurements

The above unreinforced film was then laminated between two pieces of 0.5 oz HS1 VSP copper foil to yield a double-sided copper clad laminate using the below cycle L. Portions of the sample were etched to remove the copper for dielectric property measurements and other portions the copper were retained for copper peel strength measurements.

Cycle L: The laminate was heated from room temperature to 450° F. at a heating rate of 6° F./min, kept for 2 hours at 450° F., and cooled down to room temperature at a cooling rate of 10° F./min. The lamination pressure was around 50 psi.

Preparation of Unreinforced Samples for Flammability Test

The resin compositions were coated on PET film with an applicator and dried at 80° C. for 10 minutes so that the thickness of the resin composition layer after drying is 40 μm. The resin sheet was laminated to both sides of a FR-4 substrate which has 0.2 mm of thickness without copper foils using a batch-type vacuum-pressure laminator MVLP-300. Lamination was performed by reducing the pressure for 30 seconds to a pressure of 13 Pa or less. The laminate was then pressed at 110° C. for 30 seconds at a pressure of 1.0 MPa. After the PET film was peeled off from the support, a 40 μm-thick resin sheet was laminated on both sides in the same manner until the thickness reached 160 μm. The PET film was peeled off and the laminated sample was cured at 230° C. for 2 hours under nitrogen atmosphere. The cured sample was cut into pieces of 12.7 mm in width and 12.7 mm in length. A set of five samples was prepared as described above.

General Procedure 2
Property Measurements
Resin Content (RC)

The weight of glass cloth was measured before it was coated with a curable composition. After coating and drying, the total weight of the prepreg thus formed was measured. RC was calculated based on the following equation:

RC=(Total prepreg weight−Glass cloth weight)/(Total prepreg weight)×100%

Cu Peel Strength Test

Cu peel strength was measured from laminates prepared from 2116NE glass based on 1 oz Cu weight per unit area using the IPC-TM-650 TEST METHODS MANUAL 2.4.8. Peel Strength. United SS™-1 Model was used for Cu peel strength measurement.

Dk and Df Tests

Df and Dk values were analyzed by using Split Post Dielectric Resonator (SPDR) methods. The Df and Dk values at 10 GHz were measured by Network Analyzer N5230A from Agilent Technologies. "AB" refers to the measurement after keeping samples at 120° C. for 2 hours. "RT" refers to the measurement after keeping samples under 45-55% humidity at room temperature for 16 hours. The Dk and Df results mentioned below were obtained from laminates prepared from 1078NE glass, except for CE-6 (whose data were obtained from laminates prepared from 2116NE glass) and FE-25 to FE-29, and FE-31 to FE-35.

Resin Flow

Resin Flow of an unreinforced film was measured using the IPC-TM-650 TEST METHODS MANUAL 2.3.17.

CTE Measurements

CTE (z-axis) values from 25° C. to 260° C. were measured by TMA 450 from TA Instruments using 0.25 inch by 0.25 inch of unreinforced laminates.

Flammability

Flammability was evaluated based on UL94 using a 12-ply laminate with 2116NE glass cloth or using the unreinforced laminate with FR-4 substrate as written in GENERAL PROCEDURE 1.

Example 1: Preparation and Characterization of Curable Compositions and Comparative Curable Compositions Formulation Examples 1-14, 16-20, and 23-24 (FE-1 to FE-14, FE-16 to FE-20, and FE-23 to FE-24) were prepared according to General Procedure 1. The components of these compositions and the properties of the laminates formed from these compositions are summarized in Tables 1 and 2 below. The percentage shown in Table 1 refers to the weight percentage of a component in the total solid content of a composition. The laminates were made from 1078NE or 2116NE glass cloth prepreg sheets and 1 oz HS2-M2-VSP Copper foil (Mitsui Mining & Smelting). FE-1 to FE-11 except for FE-9 were cured using Cycle A. FE-9 was cured using Cycle D. FE-12 was cured using Cycle B. FE-13, FE-14, FE-16, and FE-19 to FE-20 were cured using Cycle C. FE-17 and FE-18 were cured using Cycle E. FE-24 was cured using Cycle F. FE-23 was cured using Cycle G.

TABLE 1

|  | poly(arylene ether) | Flame Retardant | Elastomer | Filler | Crosslinker | Initiator | Total |
|---|---|---|---|---|---|---|---|
| FE-1 | HC-G0021 | PQ60 | None | EQ2410-SMC | BVPE | CCDFB | 100% |
|  | 34.26% | 17.68% |  | 45% | 2.17% | 0.89% |  |
| FE-2 | HC-G0021 | PQ60 | None | EQ2410-SMC | BVPE | CCDFB | 100% |
|  | 34.26% | 17.68% |  | 41.95% | 4.34% | 1.77% |  |

TABLE 1-continued

| | poly(arylene ether) | Flame Retardant | Elastomer | Filler | Crosslinker | Initiator | Total |
|---|---|---|---|---|---|---|---|
| FE-3 | HC-G0021 30.48% | PQ60 17.97% | SEBS-A 0.54% Septon 2104 2.16% | EQ2410-SMC 45.74% | BVPE 2.21% | CCDFB 0.9% | 100% |
| FE-4 | HC-G0021 30.48% | BES5-1150P 16.31% | SEBS-A 0.54% Septon 2104 2.16% | EQ2410-SMC 45.74% | BVPE 3.32% | CCDFB 1.45% | 100% |
| FE-5 | HC-G0021 30.27% | BES5-1150P 16.89% | Septon 2104 3.30% | EQ2410-SMC 45.42% | BVPE 2.68% | CCDFB 1.44% | 100% |
| FE-6 | HC-G0021 30.48% | BES5-1150P 16.31% | Kraton 1536 0.54% Septon 2104 2.16% | EQ2410-SMC 45.74% | BVPE 3.32% | CCDFB 1.45% | 100% |
| FE-7 | HC-G0021 30.48% | BES5-1150P 17.97% | Copolymer A 1.11% SEBS-A 0.54% Septon 2104 2.16% | EQ2410-SMC 45.74% | BVPE 1.11% | CCDFB 0.9% | 100% |
| FE-8 | HC-G0030 31.87% | BES5-1150P 19.69% | SEBS-A 0.43% M1913 0.43% Septon 2104 3.44% | EQ1010-SMC 40.60% | BVPE 2.36% | CCDFB 1.18% | 100% |
| FE-9 | HC-G0030 26.89% HC-G0024 2.99% | BES5-1150P 15.86% PX-200 1.98% | SEBS-A 0.69% SBS-A 1.95% Septon 2104 1.96% | EQ2410-SMC 46.8% | None | CCDFB 0.88% | 100% |
| FE-10 | HC-G0030 29.84% | BES5-1150P 17.59% | SBS-A 2.11% Septon 2104 2.11% | EQ2410-SMC 44.78% | BVPE 2.60% | CCDFB 0.88% VR-110 0.09% | 100% |
| FE-11 | HC-G0030 32.30% | PQ-60 17.97% | MSEBMS 3.17% | EQ2410-SMC 28.97% EQ1010-SMC 14.48% | BVPE 2.21% | CCDFB 0.90% | 100% |
| FE-12 | HC-G0030 31.62% | BES5-1150P 17.59% | MSEBMS 3.10% Septon 2104 0.57% | EQ2410-SMC 28.35% EQ1010-SMC 14.18% | BVPE 3.25% | CCDFB 1.32% Perbutyl D 0.02% | 100% |
| FE-13 | HC-G0030 17.13% SA9000 17.13% | BES5-1150P 17.68% | None | EQ2410-SMC 45.00% | BVPE 2.17% | CCDFB 0.89% | 100% |
| FE-14 | HC-G0030 30.48% | OP945 17.97% | SEBS-A 0.54% Septon 2104 2.16% | EQ2410-SMC 45.74% | BVPE 2.21% | CCDFB 0.90% | 100% |
| FE-15 | HC-G0030 21.40% HC-G0024 8.71% | BES5-1150P 17.62% | SBS-A 1.71% MP-10 2.60% | EQ2410-SMC 46.78% | LME 11613 0.45% | CCDFB 0.73% | 100% |
| FE-16 | HC-G0030 30.48% | Altexia 17.97% | SEBS-A 0.54% Septon 2104 2.16% | EQ2410-SMC 45.74% | BVPE 2.21% | CCDFB 0.90% | 100% |
| FE-17 | HC-G0030 30.48% | PX-200 17.97% | SEBS-A 0.54% Septon 2104 2.16% | EQ2410-SMC 45.74% | BVPE 2.21% | CCDFB 0.90% | 100% |
| FE-18 | HC-G0030 30.48% | DiDOPO 17.97% | SEBS-A 0.54% Septon 2104 2.16% | EQ2410-SMC 45.74% | BVPE 2.21% | CCDFB 0.90% | 100% |
| FE-19 | HC-G0030 30.48% | BES5-1150P 16.31% | SBS-A 0.54% Septon 2104 2.16% | EQ2410-SMC 45.74% | BVPE 3.32% | CCDFB 1.45% | 100% |

TABLE 1-continued

| | poly(arylene ether) | Flame Retardant | Elastomer | Filler | Crosslinker | Initiator | Total |
|---|---|---|---|---|---|---|---|
| FE-20 | HC-G0030 30.48% | FP-72TP 17.97% | SEBS-A 0.54% Septon 2104 2.16% | EQ2410-SMC 45.74% | BVPE 2.21% | CCDFB 0.90% | 100% |
| FE-21 | HC-G0030 25.4% HC-G0024 4.48% | BES5-1150P 17.62% | SBS-A 1.73% MP-10 2.65% | EQ2410-SMC 46.8% | LME 11613 0.43% | CCDFB 0.89% | 100% |
| FE-22 | HC-G0030 24.8% HC-G0024 5.08% | BES5-1150P 17.62% | SBS-A 1.73% MP-10 2.25% Septon 2104 0.40% | EQ2410-SMC 46.8% | LME 11613 0.43% | CCDFB 0.89% | 100% |
| FE-23 | HC-G0030 23.11% HC-G0024 4.98% | BES5-1150P 17.28% | SBS-A 0.57% MP-10 2.56% | EQ2410-SMC 47.83% | BVPE 2.12% TAIC 1.2% | CC-P3 0.35% | 100% |
| FE-24 | HC-G0030 25.94% HC-G0024 5.31% | BES5-1150P 18.43% | SBS-A 1.47% MP-10 2.77% | EQ2410-SMC 43.08% HS-200-VN 1.84% | BVPE 0.79% | CC-P3 0.37% | 100% |

TABLE 2

| | Copper Peel (WG/XG; lbs/inch) | Dk [AB] | Dk [IPC] | Df [AB] | Df [IPC] | RC (%) | UL94 V-0 |
|---|---|---|---|---|---|---|---|
| FE-1 | 4.2/4.2 | 3.22 | 3.20 | 0.0013 | 0.0014 | 70.6 | Pass |
| FE-2 | 3.7/3.7 | 3.25 | 3.27 | 0.0012 | 0.0012 | 71.6 | Pass |
| FE-3 | 3.5/3.0 | 3.4 | 3.4 | 0.0013 | 0.0014 | 73.8 | Pass |
| FE-4 | 3.7/3.9 | 3.36 | 3.36 | 0.0012 | 0.0014 | 72.7 | Pass |
| FE-5 | 3.2/3.3 | 3.23 | 3.23 | 0.0013 | 0.0014 | 70.0 | Pass |
| FE-6 | 3.4/3.9 | 3.32 | 3.36 | 0.0012 | 0.0014 | 76.0 | Pass |
| FE-7 | 3.0/3.0 | 3.21 | 3.21 | 0.0013 | 0.0014 | 73.4 | Pass |
| FE-8 | 2.3/2.5 | 3.10 | 3.10 | 0.0012 | 0.0015 | 67.5 | Pass |
| FE-9 | 3.2/3.2 | 3.22 | 3.22 | 0.0011 | 0.0012 | 74.2 | Pass |
| FE-10 | 3.1/3.1 | 3.28 | 3.28 | 0.0013 | 0.0013 | 70.8 | Pass |
| FE-11 | 3.3/3.2 | 3.32 | 3.36 | 0.0013 | 0.0013 | 73.7 | Pass |
| FE-12 | 3.5/3.3 | 3.23 | 3.25 | 0.0014 | 0.0015 | 69.9 | Pass |
| FE-13 | N/A/2.6 | 3.19 | 3.21 | 0.0014 | 0.0015 | 72.8 | Pass |
| FE-14 | 1.6/1.8 | 3.20 | 3.20 | 0.0018 | 0.0018 | 69.3 | Pass |
| FE-15 | 4.1/4.1 | 3.28 | 3.29 | 0.0011 | 0.0012 | 76.1 | Pass |
| FE-16 | N/A | 3.33 | 3.33 | 0.0013 | 0.0014 | 70.1 | Pass |
| FE-17 | 3.5/3.6 | 3.64 | 3.64 | 0.0016 | 0.0016 | 55.2 | Pass |
| FE-18 | 3.5/2.9 | 3.38 | 3.42 | 0.0017 | 0.0025 | 68.9 | Pass |
| FE-19 | 2.8/3.6 | 3.29 | 3.29 | 0.0013 | 0.0014 | 68.4 | Pass |
| FE-20 | 2.5/2.6 | 3.33 | 3.32 | 0.0013 | 0.0013 | 69.6 | Pass |
| FE-21 | 4.1/3.9 | 3.20 | 3.22 | 0.0012 | 0.0013 | 73.1 | Pass |
| FE-22 | 4.1/3.6 | 3.28 | 3.28 | 0.0012 | 0.0013 | 73.8 | Pass |
| FE-23 | 4.3/4.2 | 3.37 | 3.37 | 0.0012 | 0.0014 | 72.1 | Pass |
| FE-24 | 3.7/3.4 | 3.18 | 3.19 | 0.0013 | 0.0013 | 71.3 | Pass |

As shown in Table 2, FE-1 to FE-14, FE-16 to FE-20, and FE-23 to FE-24 (all of which included a N-containing poly(arylene ether) and a phosphorus-containing flame retardant) surprisingly exhibited superior electrical properties (e.g., relatively low Df) and mechanical properties (e.g., relatively high Cu peel strength, i.e., above 3.0 lbs/in).

In addition, as shown in Table 2, the inventive examples exhibited superior flame resistance and generally met the UL94 V-0 flammability standard.

Comparative Formulation Examples 1-10 (CE-1 to CE-10) were prepared according to General Procedure 1. The components of these compositions and the properties of the laminates formed from these compositions are summarized in Tables 3 and 4 below. The percentage shown in Table 3 refers to the weight percentage of a component in the total solid content of a composition. The laminates were made from 1078NE or 2116NE glass cloth and 1 oz HS1-M2-VSP Copper foil (Mitsui Mining & Smelting). CE-1 and CE-2 were cured using Cycle H. CE-3 to CE-5 were cured using Cycle I. CE-6 to CE-9 were cured using Cycle J. CE-10 was cured using Cycle K.

TABLE 3

| | poly(arylene ether) | Flame Retardant | Elastomer | Filler | Crosslinker | Initiator | Total |
|---|---|---|---|---|---|---|---|
| CE-1 | SA9000 26.01% | OP945 19.53% PQ-60 10.07% SPV-100 3.00% | MSEBMS 6.57% | EQ2410-SMC 20% OFS-6224 0.56% OFS-6124 0.28% SIB1817.0 0.10% | TAIC 13.73% | VulCup R 0.15% | 100% |
| CE-2 | SA9000 18.10% | OP935 20.95% BES5-1150P 7.59% SPV-100 | MSEBMS 5.98% | EQ2410-SMC 25.02% OFS-6224 0.54% OFS-6124 | TAIC 18.10% | VulCup R 0.15% | 100% |

TABLE 3-continued

|  | poly(arylene ether) | Flame Retardant | Elastomer | Filler | Crosslinker | Initiator | Total |
|---|---|---|---|---|---|---|---|
|  |  | 3.22% |  | 0.27% SIB1817.0 0.08% |  |  |  |
| CE-3 | SA9000 17.08% | OP935 20.96% BES5-1150P 7.59% SPV-100 3.22% | MSEBMS 5.98% | EQ2410-SMC 25.00% OFS-6224 0.54% OFS-6124 0.27% SIB1817.0 0.08% | TAIC 17.08% | VulCup R 0.05% CCDFB 2.15% | 100% |
| CE-4 | SA9000 17.08% | OP935 22.50% BES5-1150P 7.59% FP-700 3.22% | MSEBMS 5.98% | EQ2410-SMC 23.46% OFS-6224 0.54% OFS-6124 0.27% SIB1817.0 0.08% | TAIC 17.08% | VulCup R 0.05% CCDFB 2.15% | 100% |
| CE-5 | SA9000 17.08% | OP935 24.18% BES5-1150P 7.59% FP-700 3.22% | MSEBMS 5.98% | EQ2410-SMC 21.78% OFS-6224 0.54% OFS-6124 0.27% SIB1817.0 0.08% | TAIC 17.08% | VulCup R 0.05% CCDFB 2.15% | 100% |
| CE-6 | SA9000 26.93% | PQ-60 28.52% | None | SC2500-SVJ 26.04% OFS-6030 0.20% | TAIC 17.95% | DYBP 0.21% DCP 0.15% | 100% |
| CE-7 | SA9000 21.38% | OP935 22.44% | Ricon 100 4.88% | SC2500-SVJ 28.72% OFS-6030 0.56% OFS-6124 0.28% SIB1817.0 0.10% | TAIC 21.38% | VulCup R 0.26% | 100% |
| CE-8 | SA9000 21.38% | Altexia 22.44% | Ricon 100 4.88% | SC2500-SVJ 28.72% OFS-6030 0.56% OFS-6124 0.28% SIB1817.0 0.10% | TAIC 21.38% | VulCup R 0.26% | 100% |
| CE-9 | SA9000 21.38% | Saytex 8010 22.44% | Ricon 100 4.88% | SC2500-SVJ 28.72% OFS-6030 0.56% OFS-6124 0.28% SIB1817.0 0.10% | TAIC 21.38% | VulCup R 0.26% | 100% |
| CE-10 | SA9000 24.01% | OP935 19.53% FP-72TP 7.07% SPV-100 3.00% | MSEBMS 6.57% | EQ2410-SMC 24.10% OFS-6224 0.56% OFS-6124 0.28% SIB1817.0 0.10% | TAIC 12.73% | VulCup R 0.05% CCDFB 2.00% | 100% |

TABLE 4

|  | Copper Peel (WG/XG; lbs/inch) | Dk [AB] | Dk [IPC] | Df [AB] | Df [IPC] | RC (%) | UL94 V-0 |
|---|---|---|---|---|---|---|---|
| CE-1 | 2.9/2.9 | 3.04 | 3.04 | 0.0020 | 0.0024 | 73.2 | FAIL |
| CE-2 | 3.3/2.8 | 3.45 | 3.41 | 0.0022 | 0.0026 | 75.5 | Pass |
| CE-3 | N/A | 3.11 | 3.14 | 0.0020 | 0.0023 | 70.6 | FAIL |
| CE-4 | 1.8/2.2 | 3.03 | 3.06 | 0.0021 | 0.0025 | 79.3 | Pass |
| CE-5 | 2.3/2.1 | 3.11 | 3.12 | 0.0021 | 0.0023 | 77.1 | FAIL |
| CE-6 | N/A/2.3 | 3.32 | 3.41 | 0.0018 | 0.0020 | 60 | Pass |
| CE-7 | 3.4/4.1 | 3.14 | 3.14 | 0.0029 | 0.0030 | 72 | Pass |
| CE-8 | 4.3/4.6 | 3.14 | 3.17 | 0.0024 | 0.0026 | 72 | Pass |

TABLE 4-continued

| | Copper Peel (WG/XG; lbs/inch) | Dk [AB] | Dk [IPC] | Df [AB] | Df [IPC] | RC (%) | UL94 V-0 |
|---|---|---|---|---|---|---|---|
| CE-9 | 5.8/5.9 | 3.22 | 3.24 | 0.0021 | 0.0026 | 76 | Pass |
| CE-10 | 3.5/3.5 | 3.18 | 3.18 | 0.0022 | 0.0024 | 72 | Pass |

As shown in Table 4, GE-1 to GE-10 (each of which did not include the poly(arylene ether) described herein) exhibited relatively poor electrical properties (e.g., relatively high Df). Without wishing to be bound by theory, it is believed that, because the PPE polymers in GE-1 to GE-10 had a relatively higher minimum melt viscosity than a curable composition of the present disclosure that includes the poly(arylene ether), these compositions need to include a lower level of silica filler than a curable composition of the present disclosure that includes the poly(arylene ether), which would lead to a higher Df. And if these compositions include higher level of silica or flame retardant, mechanical property like ILBS would be poor because of high viscosity and poor flow that cause poorer adhesiveness between the resin compositions.

In addition, CE-6 exhibited relatively poor adhesion properties (e.g., having a copper peel strength value lower than 3 lbs/in). Without wishing to be bound by theory, it is believed that the high flame-retardant level causes the reduction in copper peel strength.

Formulation Examples 25-29 and 31-35 (FE-25 to FE-29, and FE-31 to FE-35) were prepared according to the section of preparation of unreinforced films and preparation of unreinforced laminates in General Procedure 1. The components of these compositions and the properties of the laminates formed from these compositions are summarized in Tables 5 and 6 below.

TABLE 5

| | poly(arylene ether) | Flame Retardant | Elastomer | Filler | Crosslinker | Initiator | Total |
|---|---|---|---|---|---|---|---|
| FE-25 | HC-G0030 14.03% | SPV-100 22.48% BES5-1150P 18.98% | Kraton D1623 7.17% | HS-200-TM 19.56% OFS-6030 0.43% | Bisphenol A Benzoxazine 11.08% BVPE 4.93% | CCDFB 1.34% | 100% |
| FE-26 | HC-G0030 14.03% | SPV-100 22.48% BES5-1150P 18.98% | Kraton D1623 7.17% | HS-200-TM 19.56% OFS-6030 0.43% | Bisphenol A Benzoxazine 11.08% LDAIC 4.93% | CCDFB 1.34% | 100% |
| FE-27 | HC-G0030 14.03% | SPV-100 22.48% BES5-1150P 18.98% | Kraton D1623 7.17% Vector 4411 2.69% | HS-200-TM 19.56% OFS-6030 0.43% | Bisphenol A Benzoxazine 11.08% LDAIC 2.24% | CCDFB 1.34% | 100% |
| FE-28 | HC-G0030 14.40% | SPV-100 23.07% BES5-1150P 17.92% | Kraton D1623 7.35% Vector 4411 5.06% | HS-200-MT 19.01% OFS-6030 0.44% | Bisphenol A Benzoxazine 11.38% | CCDFB 1.38% | 100% |
| FE-29 | HC-G0030 14.40% | SPV-100 23.07% BES5-1150P 17.92% | Kraton D1623 7.35% Vector 4411 5.06% | HS-200-MT 19.01% OFS-6030 0.44% | P-d Benzoxazine 11.38% | CCDFB 1.38% | 100% |
| FE-30 | HC-G0030 14.40% | SPV-100 23.07% BES5-1150P 17.92% | Vector 4411 12.41% | HS-200-MT 19.01% OFS-6030 0.44% | Bisphenol A Benzoxazine 5.86% LME 11613 5.52% | CCDFB 1.38% | 100% |
| FE-31 | HC-G0030 14.40% | SPV-100 23.07% BES5-1150P 17.92% | Vector 4411 12.41% | HS-200-MT 19.01% OFS-6030 0.44% | BMI-TMH 8.97% LDAIC 2.41% | CCDFB 1.38% | 100% |
| FE-32 | HC-G0030 19.66% | SPV-100 22.89% BES5-1150P 17.77% | Kraton D1623 7.30% Vector 4411 5.02% | HS-200-TM 19.66% OFS-6030 0.44% | Bisphenol A Benzoxazine 5.81% | CCDFB 1.37% | 100% |
| FE-33 | HC-G0030 17.36% | SPV-100 22.89% BES5-1150P 17.77% | Kraton D1623 7.30% Vector 4411 5.02% | HS-200-TM 19.66% OFS-6030 0.44% | Bisphenol A Benzoxazine 5.81% BMI-TMH 2.40% | CCDFB 1.37% | 100% |
| FE-34 | HC-G0030 14.28% | SPV-100 22.89% BES5-1150P 17.77% | Kraton D1623 7.30% Vector 4411 2.50% | HS-200-TM 19.66% OFS-6030 0.44% | Bisphenol A Benzoxazine 11.29% NEX9470S 2.50% | CCDFB 1.37% | 100% |
| FE-35 | HC-G0030 17.36% | SPV-100 25.28% BES5-1150P 17.77% | Kraton D1623 7.30% Vector 4411 5.02% | HS-200-TM 19.66% OFS-6030 0.44% | Bisphenol A Benzoxazine 5.81% | CCDFB 1.37% | 100% |

TABLE 6

| | Dk [AB] | Df [AB] | Resin Flow (%) | CTE (ppm/°C.) | UL94 V-0 |
|---|---|---|---|---|---|
| FE-25 | 2.21 | 0.0024 | 92 | 41 | Pass |
| FE-26 | 2.14 | 0.0023 | 90 | 33 | Pass |
| FE-27 | 2.16 | 0.0025 | 79 | 41 | Pass |
| FE-28 | 2.13 | 0.0026 | 81 | 31 | Pass |
| FE-29 | 2.16 | 0.0026 | 89 | 26 | Pass |
| FE-30 | 2.20 | 0.0021 | N/A | 39 | Pass |
| FE-31 | 2.24 | 0.0019 | 68 | N/A | Pass |
| FE-32 | 2.20 | 0.0019 | 88 | 48 | Pass |
| FE-33 | 2.20 | 0.0019 | 77 | 62 | Pass |
| FE-34 | 2.21 | 0.0022 | 83 | 43 | Pass |
| FE-35 | 2.19 | 0.0020 | 91 | 41 | Pass |

As shown in Table 6, FE-25 to FE-29, and FE-31 to FE-35 (all of which included a N containing poly(arylene ether) and a phosphorus-containing flame retardant) surprisingly exhibited extremely low Dk, high Resin Flow, low CTE and good flame retardance.

Other embodiments are within the scope of the following claims.

What is claimed is:

1. A curable composition, comprising:
   at least one poly(arylene ether) polymer comprising a monomer unit of one of formulas (5)-(9):

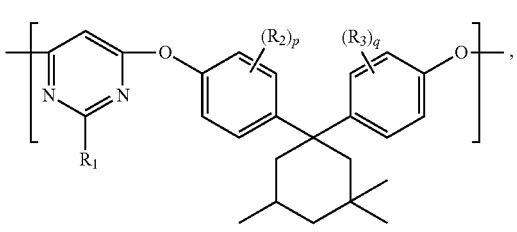

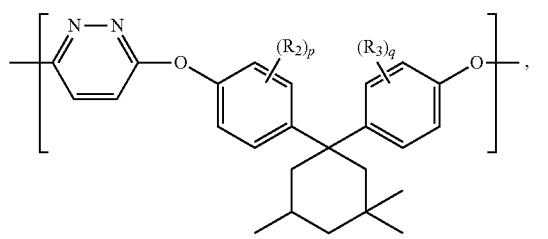

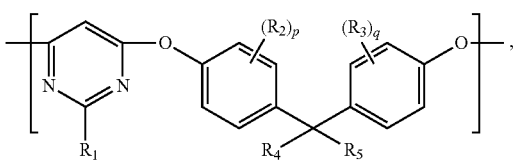

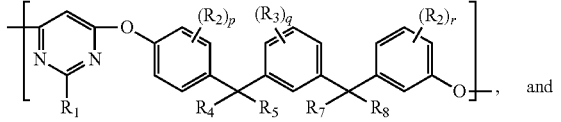

and

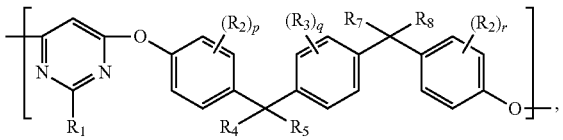

in which $R_1$ is H, $C_1$-$C_{10}$ alkyl, or aryl; each of $R_2$, $R_3$, and $R_6$, independently, is $C_1$-$C_{10}$ alkyl; each of $R_4$, $R_5$, $R_7$, and $R_8$ is H or $C_1$-$C_{10}$ alkyl; p is an integer from 0 to 4; q is an integer from 0 to 4; and r is an integer from 0 to 4;
at least one phosphorus-containing flame retardant; and
at least one radical initiator.

2. The composition of claim 1, wherein the at least one poly(arylene ether) polymer is terminated with a functional group comprising a maleimide, styrene, allyl, allyl ether, acrylate, methacrylate, isocyanurate, or benzoxazine group.

3. The composition of claim 1, wherein the at least one poly(arylene ether) polymer is present in an amount of from about 1 wt % to about 50 wt % of the solid content of the composition.

4. The composition of claim 1, wherein the at least one phosphorus-containing flame retardant comprises aluminum diethylphosphinate, p-xylylene-bis-diphenylphosphine oxide, (2,5-diallyloxyphenyl)diphenylphosphine oxide, hexaphenoxy cyclotriphosphazene, tris(2-allylphenoxy)triphenoxy cyclotriphosphazene, resorcinol bis(di-2,6-dimethylphenyl phosphate), a cyanophenoxy(phenoxy) cyclophosphazene, a cresyloxy(phenoxy) cyclophosphazene, a spirocyclophosphazene, or a vinyl-containing phosphazene.

5. The composition of claim 1, wherein the flame retardant is present in an amount of from about 1 wt % to about 50 wt % of the solid content of the composition.

6. The composition of claim 1, wherein the flame retardant is present in an amount of from about 1 wt % to about 40 wt % of the solid content of the composition.

7. The composition of claim 1, further comprising at least one filler.

8. The composition of claim 7, wherein the at least one filler comprises silica, alumina, quartz, titanium dioxide, boron nitride, barium titanate, barium strontium titanate, or polymer particles.

9. The composition of claim 7, wherein the at least one filler comprises hollow particles.

10. The composition of claim 9, wherein the hollow particles comprise hollow silica particles or hollow polymer particles.

11. The composition of claim 9, wherein the particles have an average diameter from about 0.7 μm to about 10 μm.

12. The composition of claim 7, wherein the at least one filler is present in an amount of from about 10 wt % to about 65 wt % of the solid content of the composition.

13. The composition of claim 1, wherein the at least one radical initiator comprises a peroxide, a hydrocarbon, or an azo compound.

14. The composition of claim 13, wherein the at least one radical initiator comprises bis(4-vinylphenyl)ethane, 2,2'-azobis(2,4,4-trimethylpentane), di-(tert-butylperoxyisopropyl)benzene, bis(1-methyl-1-phenylethyl) peroxide, 2,5-dimethyl-2,5-di(t-butylperoxy)hexyne-3, 2,5-dimethyl-2,5-di(t-butylperoxy)hexane, dicumyl peroxide, 3,4-dimethyl-3,4-diphenyl hexane, or 2,3-dimethyl-2,3-diphenyl butane.

15. The composition of claim 1, wherein the at least one radical initiator is present in an amount of from about 0.1 wt % to about 10 wt % of the solid content of the composition.

16. The composition of claim 1, further comprising at least one elastomer.

17. The composition of claim 16, wherein the at least one elastomer comprises a poly(styrene-ethylene-butylene-styrene) copolymer, a poly(methylstyrene-ethylene-butylene-methylstyrene) copolymer, a poly(styrene-ethylene-butylene-styrene) copolymer grafted with maleic anhydride, a poly(styrene-co-divinylbenzene-co-ethylstyrene) copolymer, a poly(methylstyrene-co-4-(dimethylvinylsilylmethyl)styrene) copolymer, a polybutadiene, a poly(butadiene-co-styrene) copolymer, a polydivinylbenzene copolymer, a poly(styrene-ethylene-propylene-styrene) copolymer, a poly(styrene-butadiene-styrene) copolymer, a poly(styrene-isoprene-styrene) copolymer, or a poly(ethylene-propylene-diene) copolymer.

18. The composition of claim 16, wherein the elastomer is present in an amount of from about 1 wt % to about 40 wt % of the solid content of the composition.

19. The composition of claim 1, further comprising at least one organic solvent.

20. The composition of claim 2, wherein the at least one organic solvent comprises methyl ethyl ketone, methyl isobutyl ketone, cyclopentanone, cyclohexanone, toluene, or xylene.

21. The composition of claim 19, wherein the at least one organic solvent is present in an amount of from about 1 wt % to about 50 wt % of the total weight of the composition.

22. The composition of claim 1, further comprising at least one cross-linking agent.

23. The composition of claim 22, wherein the at least one cross-linking agent comprises bis(4-vinylphenyl)ethane, triallylcyanurate, triallylisocyanurate, trimethallyl isocyanurate, a polybutadiene, a poly(butadiene-co-styrene) copolymer, divinylbenzene, a (meth)acrylate compound, bisphenol A diallyl ether, acenapthylene, a cyanate ester, a benzoxazine, or a bismaleimide.

24. The composition of claim 22, wherein the at least one cross-linking agent is present in an amount of from about 1 wt % to about 30 wt % of the solid content of the composition.

25. The composition of claim 1, further comprising at least one coupling agent.

26. The composition of claim 25, wherein the at least one coupling agent comprises a silane, a titanate, or a zirconate.

27. The composition of claim 26, wherein the at least one coupling agent comprises methacryloxypropyltrimethoxysilane, vinyltrimethoxysilane, hydrolyzed vinylbenzylaminoethylaminopropyltrimethoxy silane, phenyltrimethoxysilane, p-styryltrimethoxysilane, 3-isocyanatepropyltriethoxysilane, 3-methacryloxypropyl trimethoxysilane, tetra(2,2-diallyloxymethyl-1-butyl)bis(ditridecylphosphite)titanate, or tetra(2,2-diallyloxymethyl-1-butyl)bis(ditridecylphosphite)zirconate.

28. The composition of claim 25, wherein the at least one coupling agent is present in an amount of from about 0.1 wt % to about 5 wt % of the solid content of the composition.

29. The composition of claim 1, wherein the composition is substantially free of halogen.

30. The composition of claim 1, wherein a liquid phosphorus-containing flame retardant is present.

31. The composition of claim 30, wherein the liquid phosphorus-containing flame retardant is cross-linkable.

32. The composition of claim 30, wherein the liquid phosphorus-containing flame retardant is present in an amount of from about 1 wt % to about 30 wt % of the solid content of the composition.

33. The composition of claim 30, wherein the cross-linkable liquid phosphorus-containing flame retardant is tris(2-allylphenoxy)triphenoxy cyclotriphosphazene.

34. The composition of claim 33, wherein the total amount of flame retardant is from about 1 wt % to about 50 wt % of the solid content of the composition.

35. The composition of claim 30, wherein the at least one filler comprises hollow silica particles.

36. The composition of claim 35, wherein the hollow silica particles are present in an amount of from about 10 wt % to about 35 wt % of the solid content of the composition.

* * * * *